US011307225B2

(12) United States Patent
Chen et al.

(10) Patent No.: US 11,307,225 B2
(45) Date of Patent: Apr. 19, 2022

(54) TEMPERATURE BASED CONTROL OF VARIABLE VOLTAGE CONVERTER

(71) Applicant: Ford Global Technologies, LLC, Dearborn, MI (US)

(72) Inventors: Lihua Chen, Farmington Hills, MI (US); Boris Curuvija, Dearborn Heights, MI (US); Baoming Ge, Okemos, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 309 days.

(21) Appl. No.: 16/139,733

(22) Filed: Sep. 24, 2018

(65) Prior Publication Data
US 2020/0094685 A1    Mar. 26, 2020

(51) Int. Cl.
*G01R 19/165* (2006.01)
*H02M 3/335* (2006.01)

(52) U.S. Cl.
CPC .. *G01R 19/16528* (2013.01); *H02M 3/33515* (2013.01); *B60L 2210/14* (2013.01); *B60L 2210/42* (2013.01); *B60L 2240/525* (2013.01)

(58) Field of Classification Search
CPC ....... H02J 7/0008; H02J 7/0026; B60L 58/24; B60L 58/10
See application file for complete search history.

(56) References Cited

U.S. PATENT DOCUMENTS

| | | | |
|---|---|---|---|
| 4,576,132 A * | 3/1986 | Nakajima | F02D 41/064 123/179.16 |
| 8,154,254 B2 * | 4/2012 | Ichikawa | B60L 1/003 320/134 |
| 8,274,173 B2 | 9/2012 | King et al. | |
| 8,283,900 B2 * | 10/2012 | Jang | H02M 3/157 323/222 |
| 9,853,589 B2 | 12/2017 | Jing et al. | |
| 2006/0120903 A1 * | 6/2006 | Iwasaki | F01P 7/048 417/423.1 |
| 2016/0141691 A1 * | 5/2016 | Okamoto | H01M 8/04992 429/434 |
| 2016/0226421 A1 * | 8/2016 | Kadry | H02P 29/032 |
| 2018/0117992 A1 * | 5/2018 | Dienhart | B60H 1/04 |
| 2018/0302020 A1 * | 10/2018 | Sachimori | B60L 3/0038 |

* cited by examiner

*Primary Examiner* — Peter M Novak
(74) *Attorney, Agent, or Firm* — David B. Kelley; Brooks Kushman P.C.

(57) ABSTRACT

A vehicle electric drive includes a controller programmed to operate a power converter to boost voltage from a battery for a DC bus and to limit voltage output from the power converter to a predefined maximum voltage value that varies with temperature of coolant used to cool the power converter.

13 Claims, 3 Drawing Sheets

TEMPERATURE BASED CONTROL OF VARIABLE VOLTAGE CONVERTER

TECHNICAL FIELD

This disclosure relates to variable voltage converters for electric drive systems.

BACKGROUND

Electrified vehicles, including hybrid, plug-in hybrid, and electric vehicles, are designed to be propelled or partially propelled by one or several electric machines, such as AC induction machines, DC brushless electric machines, and permanent magnetic synchronous machines. Battery packs are included in the electrified vehicles providing electricity to the electric machines. Hybrid and plug-in hybrid vehicles also have built-in internal combustion engines, which are able to charge the battery pack and/or propel the electrified vehicle together with the electric machines. The battery pack includes multiple battery cells in series and/or in parallel to achieve high voltage and/or high output power to meet electric machine requirements. The battery pack also provides power to other equipment and circuits inside of the electrified vehicle, such as the DC-DC converter, on-board generator, and air conditioning system.

Hybrid electric vehicles usually employ a boost converter or so-called variable voltage converter between the battery pack and DC bus. Performance of the traction motor drive is enhanced by the variable voltage converter's boost ability, which steps up DC bus voltage from a lower battery voltage and ensures a desired DC bus voltage regardless of the power an associated motor and/or generator is consuming or generating.

SUMMARY

A vehicle electric drive includes a battery, a DC bus, a power converter electrically between the battery and DC bus, and a controller. The controller, responsive to a requested voltage value for the DC bus, operates the power converter to boost voltage from the battery toward a target value defined as a lesser of the requested voltage value and a predefined limit value that varies with temperature of coolant used to cool the power converter.

A method includes, responsive to a requested voltage value for a DC bus, operating a power converter electrically between a battery and the DC bus at a duty cycle defined as a lesser of a limit duty cycle and a requested duty cycle, that is based on a target voltage value and a voltage of the battery, to boost voltage from the battery toward the target voltage value. The target voltage value is defined as a lesser of the requested voltage value and a predefined limit voltage value that varies with temperature of coolant used to cool the power converter.

A vehicle electric drive includes a battery, a DC bus, a power converter electrically between the battery and DC bus, and a controller. The controller operates the power converter to boost voltage from the battery for the DC bus and to limit voltage output from the power converter to a predefined maximum voltage value that varies with temperature of coolant used to cool the power converter.

DETAILED DESCRIPTION

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

Figure 1:
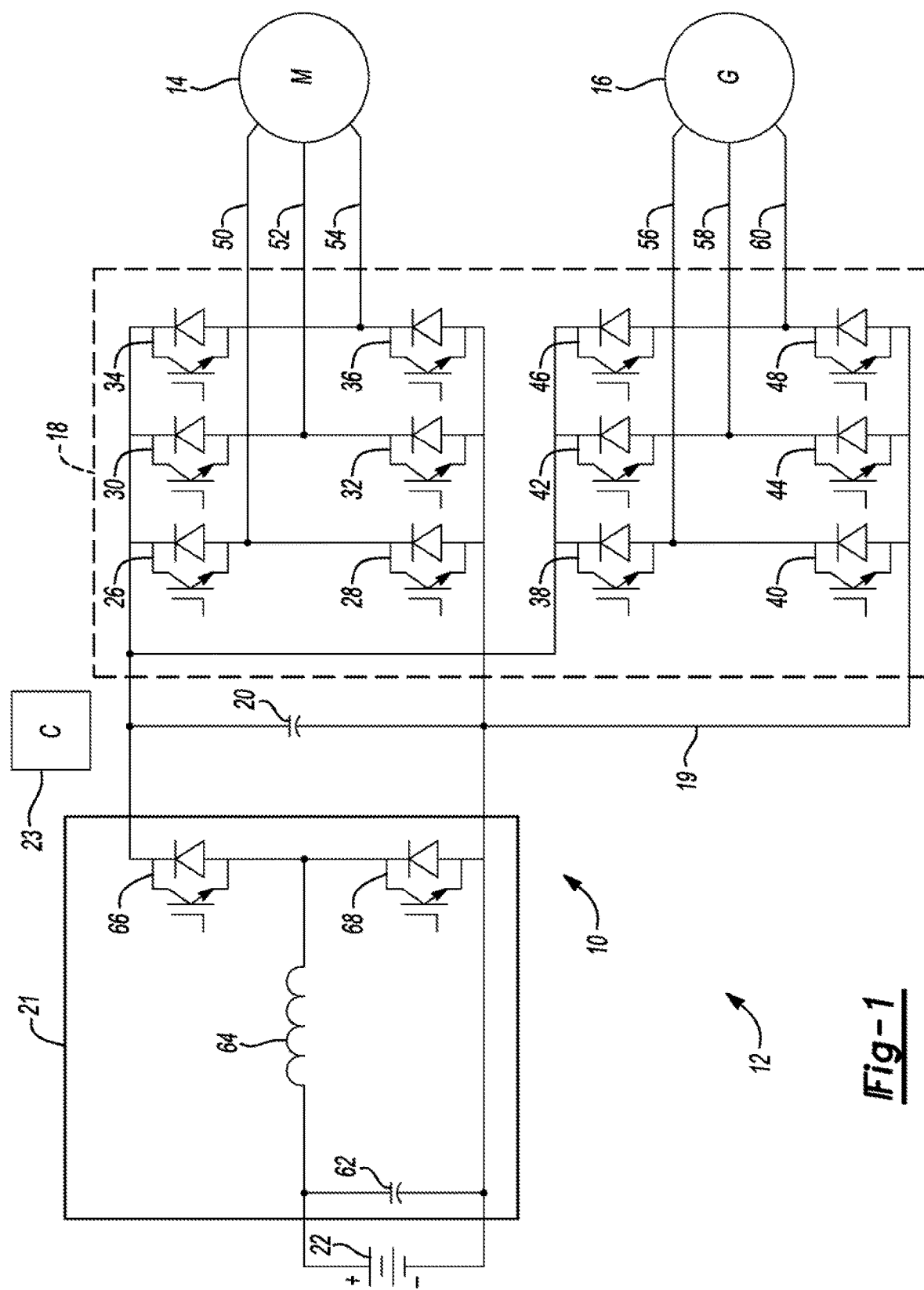
FIG. 1 is a schematic diagram of an electric drive system including a variable voltage converter.

With reference to FIG. 1, an electric drive system 10 for a vehicle 12 includes a motor 14, a generator 16, an inverter 18, a DC bus 19 including a DC link capacitor 20, a variable voltage converter 21, a traction battery 22, and a controller(s) 23. The motor 14, generator 16, inverter 18, variable voltage converter 21, and traction battery 22 are in communication with/under the control of the controller(s) 23. Voltage from the traction battery 22 can be boosted by operation of the variable voltage converter 21 and passed to the DC bus 19 for use by the inverter 18 to supply power to the motor 14 to drive wheels of the vehicle 12. Likewise, power from the motor 14 and generator 16 (captured for example during regenerative braking) can be passed to the DC bus 19 and bucked by operation of the variable voltage converter 21 to store power within the traction battery 22.

The inverter 18 includes switches 26-48. These switches are arranged in usual fashion to service respective phase legs 50, 52, 54 and 56, 58, 60 of the motor 14 and generator 16 respectively. Pairs of the switches 26-36 can be selectively activated at the command of the controller 23 to permit power to flow between the DC bus 19 and motor 14. And pairs of the switches 38-48 can be selectively activated at the command of the controller 23 to permit power to flow between the generator 16 and DC bus 19.

The variable voltage converter 21 includes an input capacitor 62, an inductor 64, and a pair of switches 66, 68. The input capacitor 62 is in parallel with the traction battery 22. The switches 66, 68 are in series. One of the terminals of the inductor 64 is shared with the input capacitor 62. And the other of the terminals of the inductor 64 is shared with the switches 66, 68. The input capacitor 62 and inductor 64 work together to limit traction battery current ripple within a required range.

Ambient and coolant temperatures associated with the electric drive system 10 have a wide range. Temperatures can range, for example, from −40° C. to +70° C. or higher. As a result, internal resistance of the traction battery 22 can significantly change. Low temperature operation such as −40° C. leads to much larger battery internal resistance, and therefore available input voltage to the variable voltage converter 21 is lowered. For example, the traction battery 22 may have an internal resistance of 0.2Ω at −40° C. If battery voltage is 200V without load, the variable voltage converter input voltage will experience a 60V drop when discharging current at 300A. Moreover, boosting a 140V battery voltage to 400V requires a much larger duty cycle, which results in high losses associated with the variable voltage converter 21. This limits power capability of the variable voltage converter 21.

Ambient and coolant temperature affects power-device voltage rating. At low temperatures, the voltage rating of a power-device is low. When temperatures rise, the voltage rating of the power-device increases. Therefore at low temperatures, the voltage of the DC bus 19 should be limited to a lower value. And at high temperatures, the voltage of the DC bus 19 can be boosted to a higher value.

Figure 2:
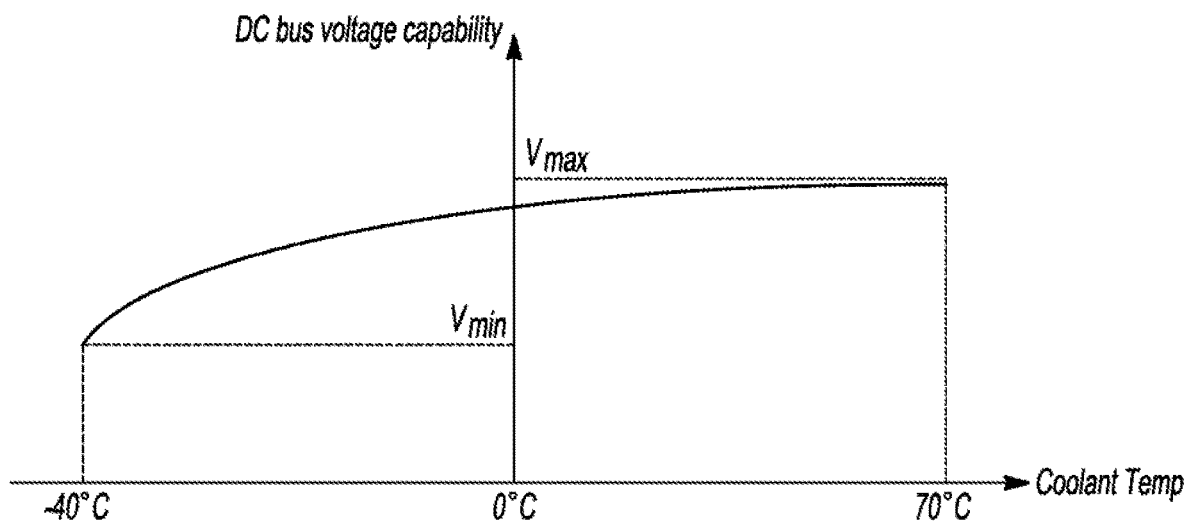
FIG. 2 is a plot showing the relationship between coolant temperature and maximum DC bus voltage.

Here, control strategies for variable voltage converters, like the variable voltage converter 21, are disclosed. The allowable output voltage of the variable voltage converter 21 increases as the temperature increases. Therefore, voltage of the DC bus 19 has a limit line as shown in FIG. 2, which is not constant. For example, at −40° C., the DC bus voltage cannot be greater than Vmin. At 70° C., the DC bus voltage cannot be greater than Vmax, which is much higher than Vmin. Such curve data can be stored in a lookup table accessible by the controller(s) 23.

Figure 3:
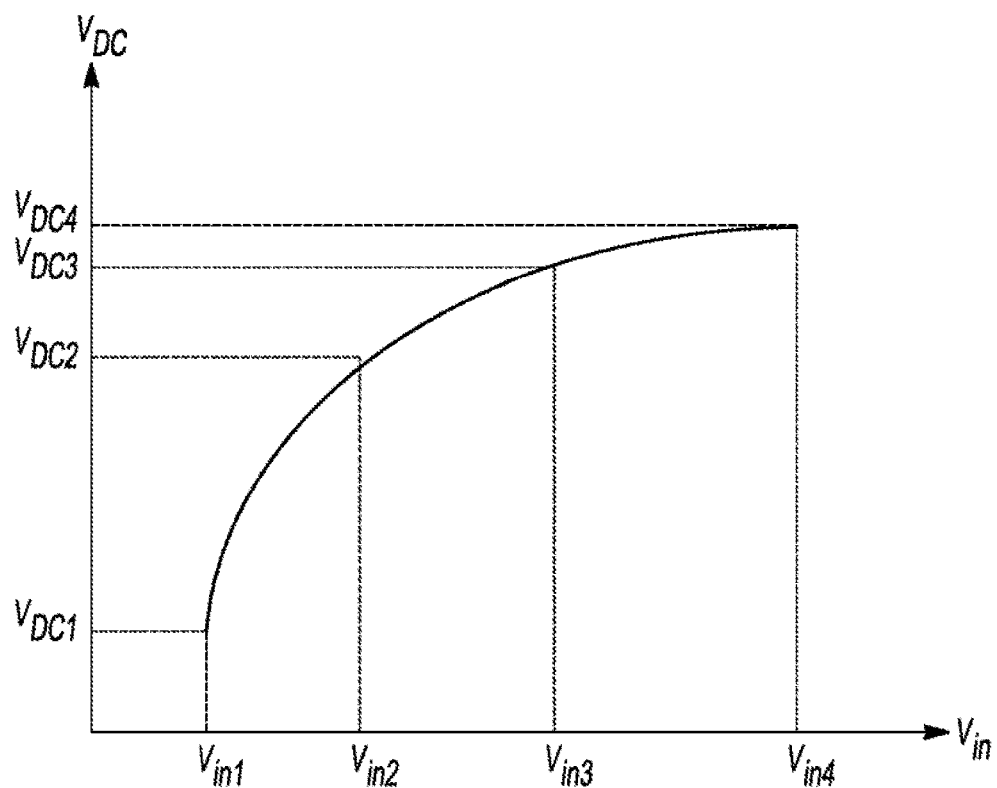
FIG. 3 is a plot showing the relationship between variable voltage converter input voltage and DC bus output voltage.

The target voltage of the DC bus 19 may be controlled with respect to coolant temperature (coolant used to cool the variable voltage converter 21), battery voltage, and allowable maximum duty cycle. As such, the target DC bus voltage can be obtained from FIG. 3. That is, the target DC bus voltage will be limited by the allowable maximum DC bus voltage (although the target can be less than the maximum) and the allowable maximum duty cycle. Given battery voltage and the target DC voltage, the required duty cycle D to achieve the target DC bus voltage can be calculated in usual fashion. For example, the duty cycle, D, of the switch 68 can be calculated as 1−(voltage of the traction battery 22/voltage of the DC bus 10). If the calculated D is larger than the value of the allowable maximum duty cycle (e.g., 85%), the controller(s) 23 outputs the allowable maximum duty cycle to control the switches 66, 68. Otherwise, the controller(s) 23 outputs the calculated D to control the switches 66, 68. Hence, there are two limits that govern output of the variable voltage converter 21: the coolant temperature based maximum allowable voltage of the DC bus 19 and the maximum allowable duty cycle, which has a constant value in certain implementations.

DC bus boost voltage is thus optimized according to device characteristic, coolant temperature, battery voltage, and allowable maximum duty cycle. In addition, the allowable maximum duty cycle is applied to reduce variable voltage converter loss when outputting highest power. Moreover, this proposed control method can boost voltage with variable conversion ratio during low or high temperature operation. Variable voltage converter efficiency may also be improved as voltage is boosted as a function of battery state of charge, coolant temperature, and allowable maximum duty cycle.

Figure 4:
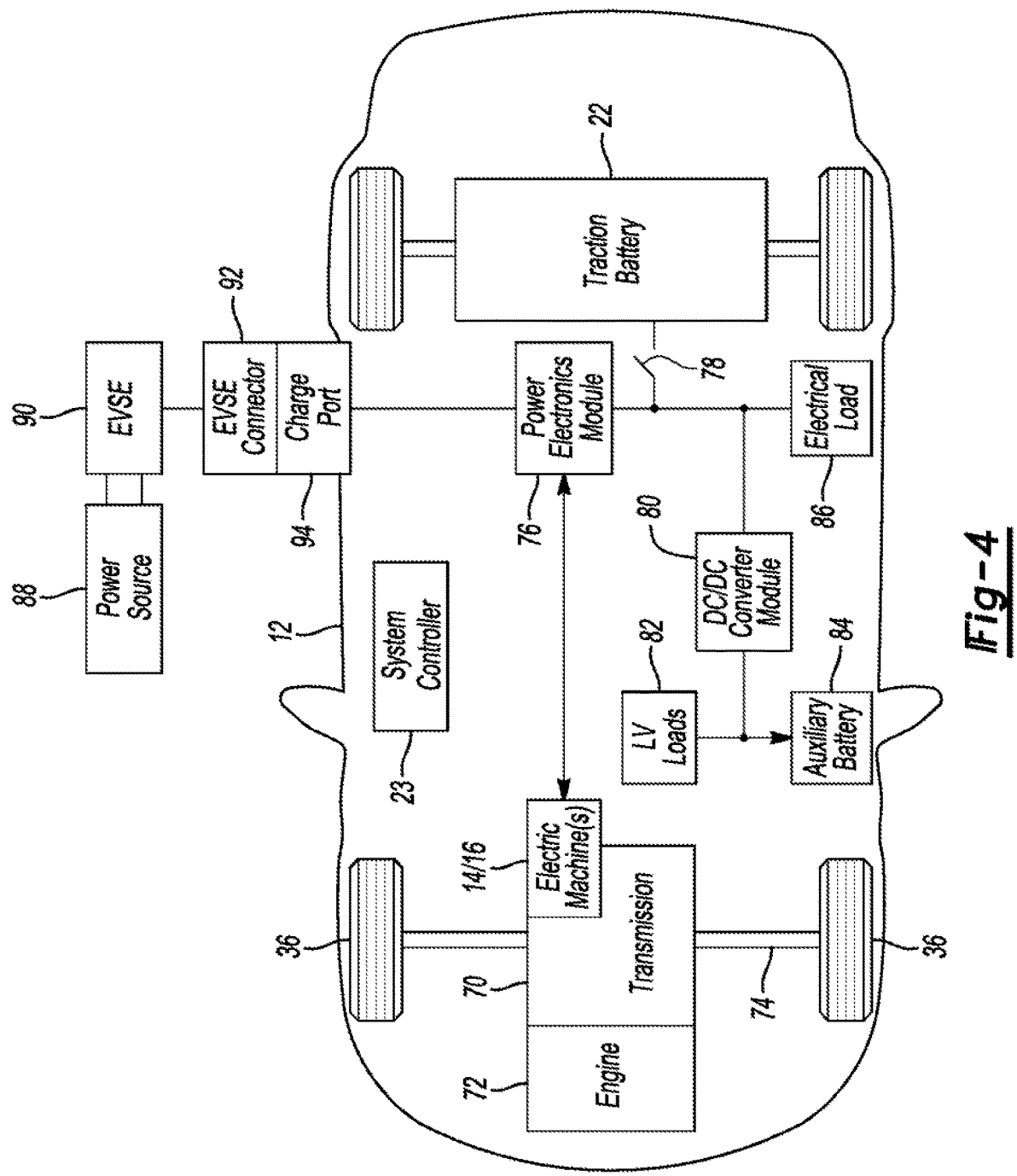
FIG. 4 is a schematic diagram of a vehicle.

FIG. 4 shows further example componentry associated with the vehicle 12. The electric machines 14/16 are mechanically coupled to a hybrid transmission 70, and the hybrid transmission 70 is mechanically coupled to an engine 72 and a drive shaft 74 that is mechanically coupled to the wheels 36.

The traction battery or battery pack 22 stores energy that can be used by the electric machines 14/16. The vehicle battery pack 22 may provide a high voltage direct current (DC) output. The traction battery 22 may be electrically coupled to one or more power electronics modules 76 that implement the inverter 18, variable voltage converter 21, etc. One or more contactors 78 may further isolate the traction battery 22 from other components when opened, and connect the traction battery 22 to other components when closed. The power electronics module 76 is also electrically coupled to the electric machines 14/16 and provides the ability to bi-directionally transfer energy between the traction battery 22 and the electric machines 14/16. For example, the traction battery 22 may provide a DC voltage while the electric machines 14/16 may operate with alternating current (AC) to function. The power electronics module 76 may convert the DC voltage to AC current to operate the electric machines 14/16. In regenerative mode, the power electronics module 76 may convert the AC current from the electric machines 14/16 acting as generators to DC voltage compatible with the traction battery 22.

In addition to providing energy for propulsion, the traction battery 22 may provide energy for other vehicle electrical systems. The vehicle 12 may include a DC/DC converter module 80 that converts the high voltage DC output of the traction battery 22 to a low voltage DC supply that is compatible with low-voltage vehicle loads 82. An output of the DC/DC converter module 80 may be electrically coupled to an auxiliary battery 84 (e.g., 12V battery) for charging the auxiliary battery 84. The low-voltage systems may be electrically coupled to the auxiliary battery 84. One or more electrical loads 86 may be coupled to the high-voltage bus. The electrical loads 86 may have an associated controller that operates and controls the electrical loads 86 when appropriate. Examples of electrical loads 86 may include a fan, an electric heating element, and/or an air-conditioning compressor.

The electrified vehicle 12 may be configured to recharge the traction battery 22 from an external power source 88. The external power source 88 may be a connection to an electrical outlet. The external power source 88 may be electrically coupled to a charger or electric vehicle supply equipment (EVSE) 90. The external power source 88 may be an electrical power distribution network or grid as provided by an electric utility company. The EVSE 90 may provide circuitry and controls to regulate and manage the transfer of energy between the power source 88 and the vehicle 12. The external power source 88 may provide DC or AC electric power to the EVSE 90. The EVSE 90 may have a charge connector 92 for plugging into a charge port 94 of the vehicle 12. The charge port 94 may be any type of port configured to transfer power from the EVSE 90 to the vehicle 12. The EVSE connector 92 may have pins that mate with corresponding recesses of the charge port 94. Alternatively, various components described as being electrically coupled or connected may transfer power using a wireless inductive coupling.

In some configurations, the electrified vehicle 12 may be configured to provide power to an external load. For example, the electrified vehicle may be configured to operate as a back-up generator or power outlet. In such applications, a load may be connected to the EVSE connector 90 or other outlet. The electrified vehicle 12 may be configured to return power to the power source 88. For example, the electrified vehicle 12 may be configured to provide alternating current (AC) power to the electrical grid. The voltage supplied by the electrified vehicle may be synchronized to the power line.

Electronic modules in the vehicle 12 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by the Institute of Electrical and Electronics Engineers (IEEE) 802 family of standards. Additional channels of the vehicle network may include discrete connections between modules and may include power signals from the auxiliary battery 84. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown but it may be implied that the vehicle network may connect to any electronic module that is present in the vehicle 12.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure and claims.

As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A vehicle electric drive comprising: a battery; a DC bus; a power converter electrically between the battery and DC bus; and a controller programmed to, responsive to a requested voltage value for the DC bus, operate the power converter (i) to boost voltage from the battery toward a target value defined as a lesser of the requested voltage value and a predefined maximum limit value that varies with temperature of coolant used to cool the power converter and (ii) at a duty cycle defined as a lesser of a non-zero limit duty cycle and a non-zero requested duty cycle that is based on the target value and a voltage of the battery, wherein the limit value decreases as the temperature decreases and wherein the controller is further configured to limit the duty cycle to a maximum duty cycle value.

2. The vehicle electric drive of claim 1, wherein the limit value increases as the temperature increases.

3. The vehicle electric drive of claim 1 further comprising a motor and an inverter electrically between the DC bus and motor, wherein the inverter is configured to transfer power from the DC bus to the motor.

4. The vehicle electric drive of claim 1 further comprising a generator and an inverter electrically between the DC bus and generator, wherein the inverter is configured to transfer power from the generator to the DC bus.

5. A method comprising:
responsive to a requested voltage value for a DC bus, operating a power converter electrically between a battery and the DC bus at a duty cycle defined as a lesser of a non-zero limit duty cycle and a non-zero requested duty cycle, that is based on a target voltage value and a voltage of the battery, to boost voltage from the battery toward the target voltage value, wherein the target voltage value is defined as a lesser of the requested voltage value and a predefined limit voltage value that varies with temperature of coolant used to cool the power converter and wherein the limit voltage value decreases as the temperature decreases; and limiting the duty cycle to a maximum duty cycle value.

6. The method of claim 5, wherein the limit voltage value increases as the temperature increases.

7. The method of claim 5 further comprising operating an inverter electrically between the DC bus and a motor to transfer power from the DC bus to the motor.

8. The method of claim 5 further comprising operating an inverter electrically between the DC bus and a generator to transfer power from the generator to the DC bus.

9. A vehicle electric drive comprising: a battery; DC bus; a power converter electrically between the battery and DC bus; and a controller programmed to operate the power converter to boost voltage from the battery for the DC bus and to limit voltage output from the power converter to a predefined maximum voltage value that varies with temperature of coolant used to cool the power converter, wherein the maximum voltage value decreases as the temperature decreases, and at a duty cycle defined as a lesser of a limit duty cycle and a requested duty cycle that is based on a target value and a voltage of the battery, and limit the duty cycle to a maximum duty cycle value.

10. The vehicle electric drive of claim 9 wherein the maximum duty cycle value is constant.

11. The vehicle electric drive of claim 9, wherein the maximum voltage value increases as the temperature increases.

12. The vehicle electric drive of claim 9 further comprising a motor and an inverter electrically between the DC bus and motor, wherein the inverter is configured to transfer power from the DC bus to the motor.

13. The vehicle electric drive of claim 9 further comprising a generator and an inverter electrically between the generator and DC bus and motor, wherein the inverter is configured to transfer power from the generator to the DC bus.

* * * * *